United States Patent
Choi

(10) Patent No.: US 9,562,798 B2
(45) Date of Patent: Feb. 7, 2017

(54) DEPOSITION RATE MEASURING APPARATUS

(71) Applicant: SAMSUNG DISPLAY CO., LTD., Yongin, Gyeonggi-Do (KR)

(72) Inventor: Hee Dok Choi, Incheon (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 28 days.

(21) Appl. No.: 14/754,781

(22) Filed: Jun. 30, 2015

(65) Prior Publication Data

US 2016/0216143 A1 Jul. 28, 2016

(30) Foreign Application Priority Data

Jan. 22, 2015 (KR) .................. 10-2015-0010852

(51) Int. Cl.
 *G01N 17/00* (2006.01)
 *G01F 1/66* (2006.01)
 *H01L 21/67* (2006.01)
 *C23C 14/54* (2006.01)

(52) U.S. Cl.
 CPC .............. *G01F 1/662* (2013.01); *C23C 14/546* (2013.01); *H01L 21/67253* (2013.01)

(58) Field of Classification Search
 CPC ........... G01N 17/00; G01D 21/00; G01G 9/00
 USPC . 73/865.8, 865, 866.5; 118/688, 715; 427/9; 356/72
 See application file for complete search history.

(56) References Cited

U.S. PATENT DOCUMENTS

| | | | |
|---|---|---|---|
| 6,798,499 B2* | 9/2004 | Umeda | C23C 14/546 356/630 |
| 7,871,667 B2* | 1/2011 | Awata | C23C 14/16 427/10 |
| 8,546,205 B2* | 10/2013 | Luu | H01L 21/2855 427/250 |
| 2004/0187580 A1 | 9/2004 | Nozaki | |
| 2008/0000496 A1* | 1/2008 | Kim | C23C 14/12 134/1 |
| 2014/0127833 A1* | 5/2014 | Kim | C23C 16/52 438/5 |
| 2014/0165747 A1* | 6/2014 | Choi | C23C 14/542 73/866.5 |

FOREIGN PATENT DOCUMENTS

| | | |
|---|---|---|
| JP | 2013-167007 A | 8/2013 |
| JP | 2014-070969 A | 4/2014 |
| KR | 10-2014-0081194 A | 7/2014 |

* cited by examiner

*Primary Examiner* — Jewel V Thompson
(74) *Attorney, Agent, or Firm* — Lee & Morse, P.C.

(57) ABSTRACT

A deposition rate measuring apparatus, including a crystal sensor facing a specific deposition source among a plurality of deposition sources in a deposition apparatus; a deposition-preventing bracket in a front portion of the crystal sensor, the deposition-preventing bracket having an opening that assists inflow of a specific deposition material, the deposition-preventing bracket extending from the opening, and the deposition-preventing bracket surrounding the crystal sensor to prevent interference due to at least one deposition material from at least one adjacent deposition source adjacent to the specific deposition source; and one or more cover portions spaced apart from the opening inward of the deposition-preventing bracket by a predetermined length.

11 Claims, 6 Drawing Sheets

DEPOSITION RATE MEASURING APPARATUS

CROSS-REFERENCE TO RELATED APPLICATION

Korean Patent Application No. 10-2015-0010852, filed on Jan. 22, 2015, in the Korean Intellectual Property Office, and entitled: "Deposition Rate Measuring Apparatus," is incorporated by reference herein in its entirety.

BACKGROUND

1. Field

The described technology relates to a deposition rate measuring apparatus.

2. Description of the Related Art

An organic light emitting diode (OLED) element may be a next-generation display element in which multi-layers including an organic thin films and a metal electrodes may be formed on a glass substrate on which a transparent electrode may be coated and when electricity is applied thereto, light-emitting phenomenon may occur. OLEDs may replace liquid-crystal displays (LCDs).

SUMMARY

Embodiments may be realized by providing a deposition rate measuring apparatus, including a crystal sensor facing a specific deposition source among a plurality of deposition sources in a deposition apparatus; a deposition-preventing bracket in a front portion of the crystal sensor, the deposition-preventing bracket having an opening that assists inflow of a specific deposition material, the deposition-preventing bracket extending from the opening, and the deposition-preventing bracket surrounding the crystal sensor to prevent interference due to at least one deposition material from at least one adjacent deposition source adjacent to the specific deposition source; and one or more cover portions spaced apart from the opening inward of the deposition-preventing bracket by a predetermined length.

The deposition-preventing bracket or each cover portion may be formed to have a shape such that an incident angle of the at least one deposition material is equal to or less than a predetermined angle at one or more positions.

The deposition-preventing bracket may have a cylindrical shape, a cone shape which becomes wide toward the opening, or a cone shape which becomes narrow toward the opening.

One of the one or more cover portions may be at an inner position of the deposition-preventing bracket adjacent to the crystal sensor, and another cover portion may be at another inner position of the deposition-preventing bracket far away from the crystal sensor.

Each cover portion may have a circular plate shape including a feature hole at a central portion.

A diameter of a first feature hole of a first cover portion adjacent to the crystal sensor from among the one or more cover portions may be larger than a diameter of a second feature hole of a second cover portion away from the crystal sensor.

The deposition-preventing bracket may have the cone shape which becomes narrow toward the opening, and each cover portion may be tapered in a direction of the crystal sensor with respect to an inner wall of the deposition-preventing bracket.

The deposition-preventing bracket may have a cone shape which becomes narrow toward the opening, and each cover portion may have a funnel shape which becomes wide toward the opening as opposed to the deposition-preventing bracket.

A relative position of each cover portion may be adjustable in a length direction with respect to an inner wall of the deposition-preventing bracket.

The specific deposition material may be a dopant material, and the at least one deposition material may be a host material, and the dopant material may be monitored without interference due to the host material.

The deposition-preventing bracket may have a pair of guide groove portions along the inner wall in the length direction, and each cover portion may have a pair of engaging protrusions corresponding to the pair of guide groove portions in an external circumference portion having the circular plate shape including the feature hole at the central portion.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
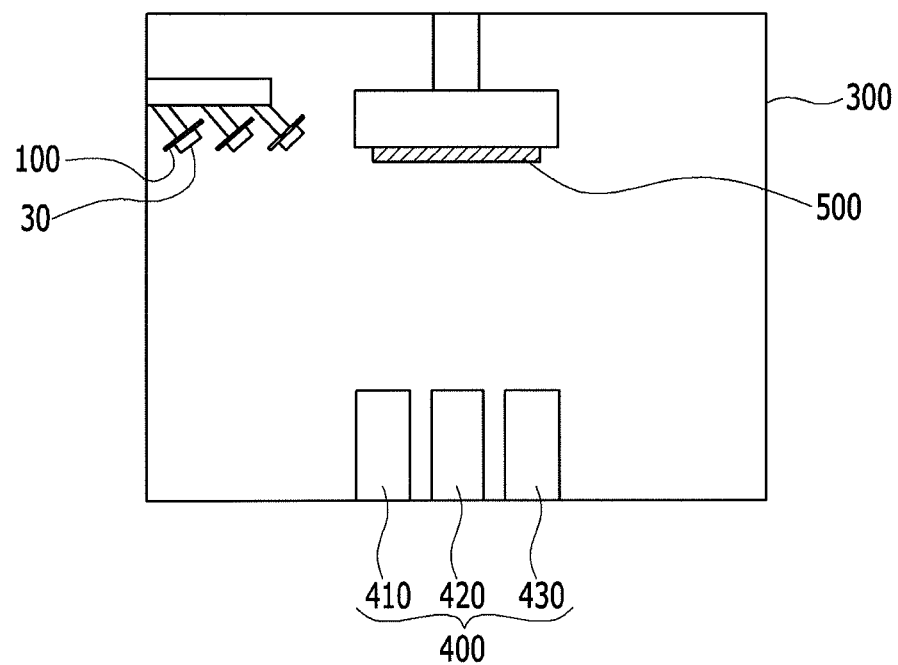
FIG. 1 illustrates a block diagram of a vacuum deposition system employing a deposition rate measuring apparatus according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of features may be exaggerated for clarity of illustration. Portions unrelated to the description will be omitted to obviously describe the exemplary embodiments, and similar components will be denoted by the same reference numerals throughout the present specification.

Hereinafter, a deposition rate measuring apparatus according to an exemplary embodiment will be described in detail with reference to FIGS. 1 to 3.

A vacuum deposition system to which the deposition rate measuring apparatus according to the exemplary embodiment may be applied may include a vacuum chamber 300, at least two deposition sources 400 which may be provided in a bottom of the vacuum chamber 300, respectively, to receive a host deposition material and at least two dopant deposition materials therewithin, and may include heating devices in the outside thereof, a process target substrate 500 which may be provided above the deposition sources 400 and on which deposition materials evaporated or sublimated from the deposition sources 400 may be deposited, and at least two deposition rate measuring apparatuses 100 which may be provided on one side of each of the at least two deposition sources 400 so as not to obstruct deposition paths between the at least two deposition sources 400, and may be provided with crystal sensors 30.

As shown in FIG. 1, the at least two deposition sources 400 may include a first deposition source 410 that may be a deposition source of a host material and second and third deposition sources 420 and 430 that may be deposition sources of at least two dopant materials.

The at least two deposition rate measuring apparatuses 100 may include first to third deposition rate measuring apparatuses which may be disposed at different angles on one side of the first to third deposition sources 410, 420, and 430 so as to monitor only the host material and the dopant materials evaporated or sublimated from the first to third deposition sources 410, 420, and 430.

The deposition rate measuring apparatus 100 may include, in a front portion of the crystal sensor 30, a deposition-preventing bracket 10 surrounding the crystal sensor 30 and having a structure that may prevent the inflow of deposition materials from the first and third deposition sources 410 and 430 which may be adjacent thereto.

The deposition-preventing bracket 10 may be formed to have a structure such that an incident angle at which the deposition materials may be incident from the first and third deposition sources 410 and 430 may be equal to or less than less than a predetermined angle.

The deposition-preventing bracket 10 may have a rectangular pillar shape or a quadrangular pyramid shape. The deposition-preventing bracket 10 may be formed to have a cylindrical shape to reflect deposition materials and cause inflow of deposition materials into the crystal sensor 30 when taking into account that the crystal sensor 30 may have a cylindrical shape.

The deposition-preventing bracket 10 may have an opening 15 that assists inflow of only a specific deposition material from the second deposition source 420 to be monitored, in a front portion of the structure.

The deposition rate measuring apparatus 100 may further include a connection portion 13 provided to surround the crystal sensor 30 to removably connect the deposition-preventing bracket 10 thereto, in the outside thereof.

The deposition-preventing bracket 10 may include one or more cover portions 50 and 60 which may be spaced apart from the opening 150 inward of the deposition-preventing bracket 10 by a predetermined length H. The one or more cover portions 50 and 60 may be formed to have a shape suitable to block inflow of deposition materials in such a manner that the spacing positions of the one or more cover portions 50 and 60 may be changed and the one or more cover portions 50 and 60 may be inclined at a predetermined angle with respect to the inner wall of the deposition-preventing bracket 10.

The one or more cover portions 50 and 60 may be formed to have a plate shape or a circular plate shape in which feature holes 55 and 65 may be formed such that materials individually evaporated or sublimated from the deposition sources 410, 420, and 430 only independently flow into the feature holes 55 and 65.

Figure 2:
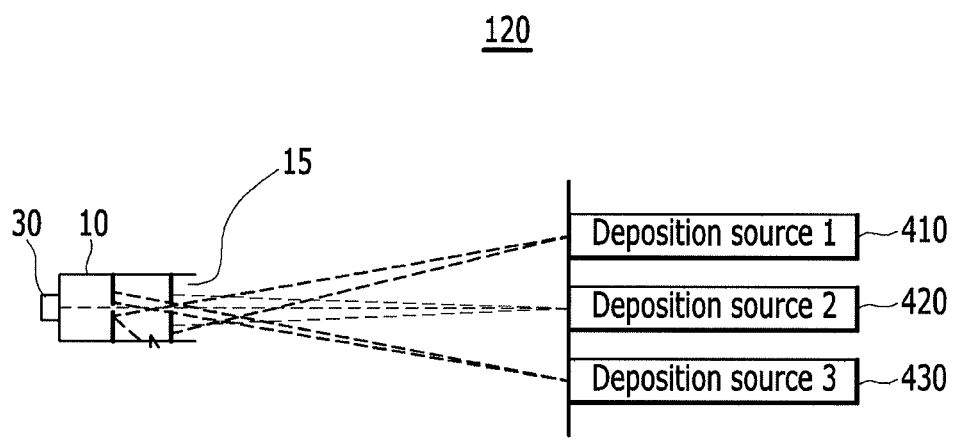
FIG. 2 illustrates a schematic view of a deposition rate measuring apparatus according to an exemplary embodiment.

According to the above-described structure, as shown in FIG. 2, even when a large amount of host material flows from the first deposition source 410, most of the host material flowing from the first deposition source 410 at a predetermined incident angle may be blocked by the one or more cover portions 50 and 60.

The second deposition rate measuring apparatus 120 may be disposed to be aligned with the second deposition source 420, and a specific dopant material evaporated or sublimated from the second deposition source 420 may flow into the feature holes 55 and 65 stably and independently. A deposition rate of the specific dopant material may be monitored without interference of the host material or other dopant materials.

Figure 3:
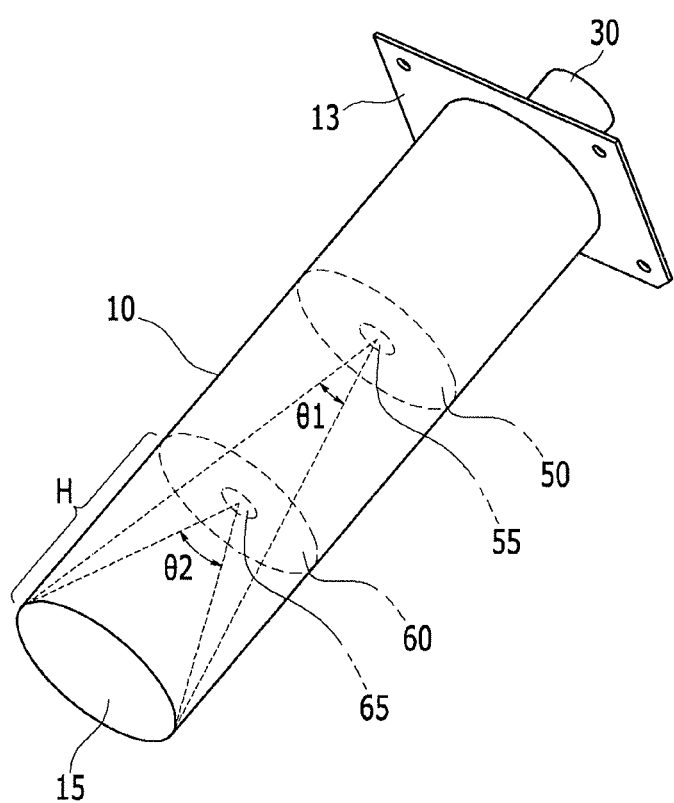
FIG. 3 illustrates a perspective view of a deposition rate measuring apparatus according to an exemplary embodiment.

As shown in FIG. 3, the one or more cover portions 50 and 60 may be disposed at a position spaced apart inward from the opening 15 of the deposition-preventing sources 410 and 430 by a predetermined length, and incident angles θ1 and θ2, at which deposition materials from the adjacent deposition sources 410 and 430 may be incident, may be limited to be equal to or less than a predetermined angle.

By disposing the first cover portion 50 of the one or more cover portions 50 and 60 at a position further inner than the second cover portion 60, for example, a position close to the crystal sensor 30 and disposing the second cover portion 60 at a position far away from the crystal sensor 30 to be spaced apart from the crystal sensor 30, it may be possible to limit a first incident angle θ1 formed by the first feature hole 55 of the first cover portion 50 to be less than a second incident angle θ2 formed by the second feature hole 65 of the second cover portion 60.

It may be possible to limit an incident angle of deposition materials flowing from the adjacent deposition sources 410 and 430 to be equal to or less than a predetermined angle depending on at which position the one or more cover portions 50 and 60 are disposed inside the deposition-preventing bracket 10.

Deposition materials from the adjacent deposition sources 410 and 430, which may occasionally flow through the second feature hole 65 of the second cover portion 60, may be blocked by the first cover portion 50 according to a spacing distance of the one or more cover portions 50 and 60, only the feature material flowing from the feature deposition source 420 may flow through the first feature hole 55 of the first cover portion 50, and accurate monitoring may be achieved.

The amount of deposition materials flowing from the adjacent deposition source into the crystal sensor 30 may be reduced, and the lifetime of the crystal sensor 30 may be increased.

A deposition rate measuring apparatus according to a modification of the exemplary embodiment will be described with reference to FIGS. 4A and 4B.

Figure 4A:
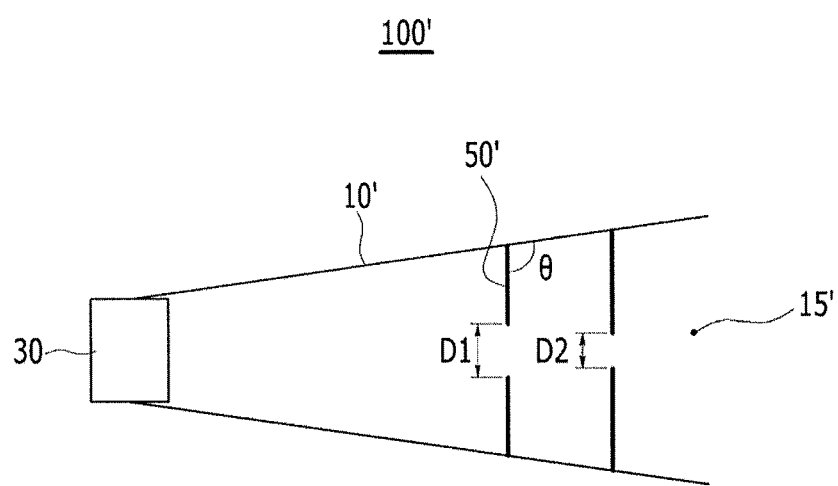
FIG. 4A and FIG. 4B illustrate vertical cross-sectional views explaining a deposition rate measuring apparatus according to a modification of the exemplary embodiment.

In the deposition rate measuring apparatus 100' according to a modification of the exemplary embodiment, a deposition-preventing bracket 10' may be formed such that an appearance has a cone shape in which an opening 15' may become wide as shown in FIG. 4A to limit an incident angle at which deposition materials evaporated or sublimated from at least two deposition sources 400 may be incident.

It may be possible to block inflow of deposition materials introduced from adjacent deposition sources 41 and 430 by reducing a size of a second feature hole 65' of a second cover portion 60' closer to the opening 15'.

In an embodiment, a diameter of a first feature hole (D1) of a first cover portion 50' spaced apart inward from the second cover portion 60' by a predetermined length may be made larger than a diameter of the second feature hole (D2), inflow of the deposition material from the second deposition source 420 to be monitored may be aided, and monitoring efficiency may be increased.

Figure 4B:
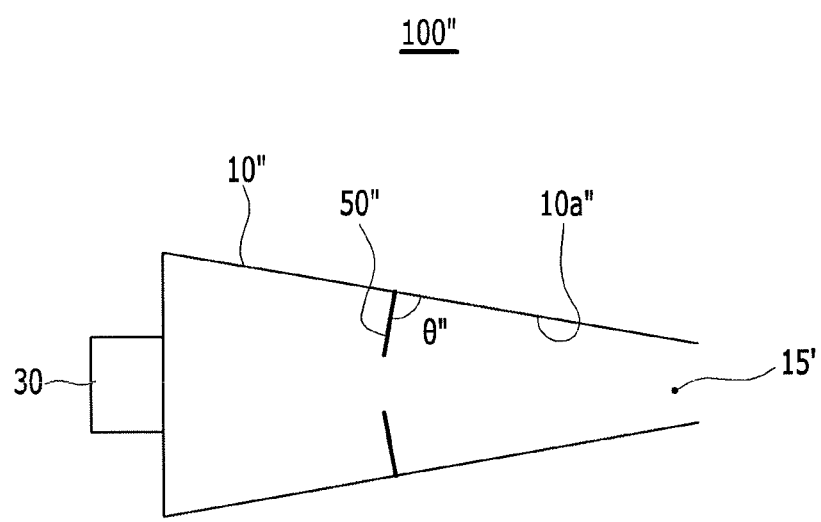

As shown in FIG. 4B, a cone shape in which the opening 15' may become narrow may be formed.

The opening 14' may become narrow, and inflow of deposition materials incident from the first and third deposition sources 410 and 430 adjacent thereto may be blocked.

In an embodiment, an inflow amount of a feature material flowing only from the second deposition source 420 without an incident angle may be reduced, and it may be possible to further increase a diameter of a first feature hole of the first cover portion 50'.

The first cover portion 50' may be disposed at a predetermined slope with respect to an inner wall 10a' of the deposition-preventing bracket 10' rather than being disposed parallel to the inner wall 10a'.

The first cover portion 50' may be tapered toward the crystal sensor 30 to have a funnel shape with respect to the inner wall 10a' of the deposition-preventing bracket 10', the feature deposition material flowing into the crystal sensor 30 may be collected, and accuracy of a deposition rate may be increased.

Figure 5:
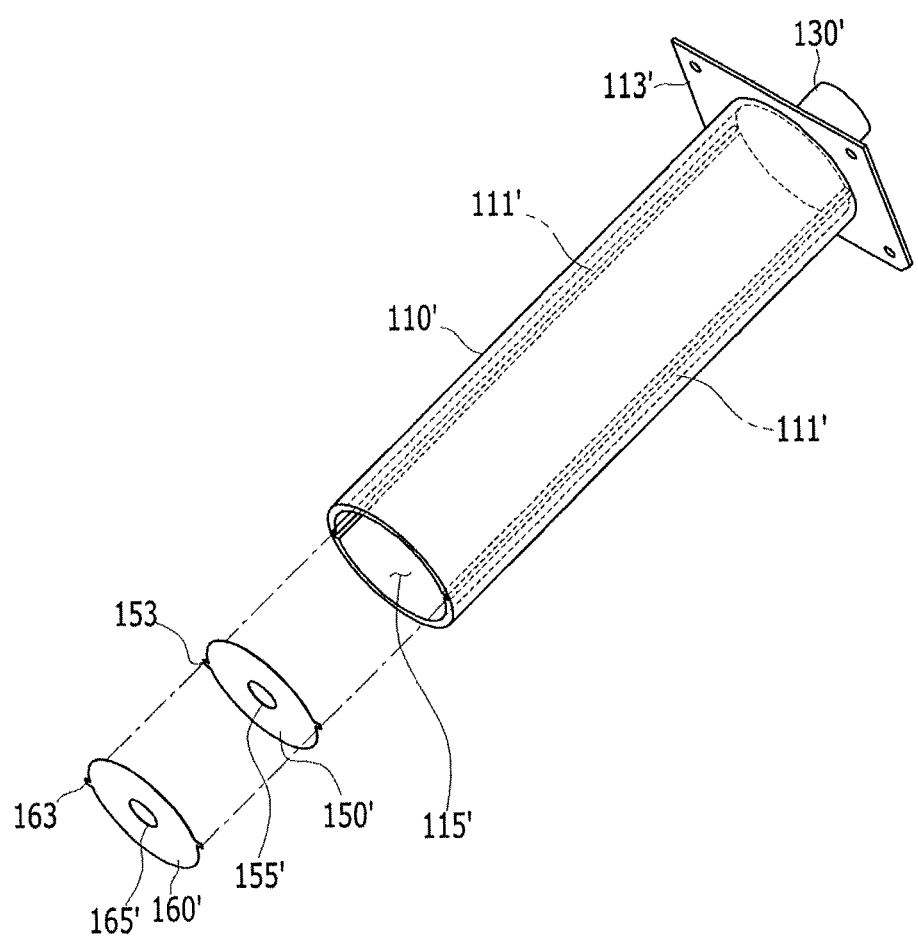
FIG. 5 illustrates a perspective view of a deposition rate measuring apparatus according to an exemplary embodiment.

A deposition rate measuring apparatus according to an exemplary embodiment will be described below with reference to FIG. 5.

The deposition rate measuring apparatus 100' according to an exemplary embodiment may include a deposition-preventing bracket 110', which may surround a crystal sensor 130' and may have an opening 115' formed in a front portion thereof, a connection portion 113', which removably may connect the deposition-preventing bracket 110', and one or more cover portions 150' and 160', which may be spaced apart from each other inward of the deposition-preventing bracket 110' by a predetermined length from the opening 115' toward the deposition-preventing bracket 110', like the deposition rate measuring apparatus 100. The appearance of the deposition-preventing bracket 110' may be a cylindrical shape or a cone shape, and may limit a distance by which the one or more cover portions 150' and 160' may be spaced apart inward from the opening 115', a tilt angle at which the one or more cover portions 150' and 160' may be inclined from the inside wall and an incident angle of deposition materials flowing from the first and third deposition sources 410' and 430' according to diameter of characteristic holes 155' and 165', and only the specific deposition material from the second deposition source 420' to be monitored may be monitored.

The inner wall 110a' of the deposition-preventing bracket 110' may have a guide groove portion 111' along a length direction, and the one or more cover portions 150' and 160' may include one or more engaging protrusions 153' and 163' corresponding to the guide groove portion 111' in an external circumference portion thereof.

The engaging protrusions 153 and 163 of the one or more cover portions 150' and 160' may be engaged with the guide groove portion 111' of the deposition-preventing bracket 110', and the one or more cover portions 150' and 160' may be moveable along the guide groove portion 111'. As a result, it may be possible to freely adjust a spacing distance of the one or more cover portions 150' and 160' from the opening 115' of the deposition-preventing bracket 110'. Incident angles θ1' and θ2' at which deposition materials may flow into the feature holes 155' and 165' may be freely adjusted according to the weight, type, and features of the deposition materials, and accuracy of measurement of a deposition rate may be increased.

By way of summation and review, an organic thin film may be formed in such a way that organic material gas evaporated when a crucible containing an organic material is heated in a high-vacuum chamber may be formed into a thin film on a glass substrate.

An organic light emitting element may be fabricated by laminating a plurality of thin films including an organic thin film and a metal thin film.

Deposition equipment for an organic light emitting element may employ a cluster scheme in which a plurality of unit chambers are connected, and may be configured to perform substrate transfer and transport, and element processes in a state in which a substrate is horizontally disposed between the respective deposition chambers.

The organic material evaporated from a deposition source may be moved to a process target substrate, and may solidify on the process target substrate through continuous processes of adsorption, deposition, and re-evaporation to form a thin film. A thickness of the thin film formed on the process target substrate may be determined by measuring a thin film deposition rate by a crystal sensor.

The crystal sensor may affect an actual film thickness and product performance of a deposition apparatus if the thickness is not measured accurately and stably by using a sensitive sensor that detects a material at an angstrom scale.

A deposition rate measuring apparatus may be installed in one side out of a deposition path in a deposition apparatus including at least two adjacent deposition sources, a deposition material evaporated from the adjacent deposition source may be introduced into a crystal sensor adjacent thereto at a predetermined angle and may cause a crosstalk in deposition rate. Therefore, it may be desirable to prevent interference by the adjacent deposition source.

When one of the at least two adjacent deposition sources is a host material and the other is a dopant material, it may be hard to monitor a deposition rate of the dopant material without being affected by a large amount of host deposition material.

When an organic material evaporated from the adjacent deposition source is deposited on the crystal sensor, a function of the crystal sensor may be rapidly deteriorated, and it may be impossible to accurately measure a thickness of an organic thin film and film deposition rate.

A deposition rate measuring apparatus may require a complicated structure and a mechanical mechanism such that the deposition rate measuring apparatus may be automatically or manually shut off to prevent an organic material evaporated from an adjacent deposition source from being deposited on an adjacent crystal sensor.

Provided is a deposition rate measuring apparatus that may prevent a deposition material evaporated from an adjacent deposition source from being input into a crystal sensor at a predetermined angle, for example, due to spatial constraints, and may monitor an individual deposition material stably and accurately, for example, due to non-occurrence of a crosstalk in deposition rate.

Provided is a deposition rate measuring apparatus that may be capable of independently monitoring a deposition rate of a dopant material without interference, for example, due to a host material, in the case of depositing the host material and the dopant material simultaneously.

Provided is a deposition rate measuring apparatus that may be capable of preventing an organic material evaporated from an adjacent deposition source from being deposited on a crystal sensor, and a lifetime of the crystal sensor may be increased.

Provided is a deposition rate measuring apparatus that may be capable of preventing an organic material evaporated from an adjacent deposition source from being deposited on a crystal sensor by using a simple structure without a complicated mechanical mechanism.

The described technology relates to deposition rate measuring apparatus that may be capable of performing measurement with respect to deposition materials that may be vaporized from respective deposition sources and may have no influence, for example, due to adjacent deposition sources, in a deposition apparatus having two or more adjacent deposition sources.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A deposition rate measuring apparatus, comprising:
   a crystal sensor facing a specific deposition source among a plurality of deposition sources in a deposition apparatus;
   a deposition-preventing bracket in a front portion of the crystal sensor, the deposition-preventing bracket having an opening that assists inflow of a specific deposition material, the deposition-preventing bracket extending from the opening, and the deposition-preventing bracket surrounding the crystal sensor to prevent interference due to at least one deposition material from at least one adjacent deposition source adjacent to the specific deposition source; and
   one or more cover portions spaced apart from the opening inward of the deposition-preventing bracket by a predetermined length.

2. The deposition rate measuring apparatus as claimed in claim 1, wherein the deposition-preventing bracket or each cover portion is formed to have a shape such that an incident angle of the at least one deposition material is equal to or less than a predetermined angle at one or more positions.

3. The deposition rate measuring apparatus as claimed in claim 2, wherein the deposition-preventing bracket has a cylindrical shape, a cone shape which becomes wide toward the opening, or a cone shape which becomes narrow toward the opening.

4. The deposition rate measuring apparatus as claimed in claim 2, wherein:
   one of the one or more cover portions is at an inner position of the deposition-preventing bracket adjacent to the crystal sensor, and
   another cover portion is at another inner position of the deposition-preventing bracket far away from the crystal sensor.

5. The deposition rate measuring apparatus as claimed in claim 4, wherein each cover portion has a circular plate shape including a feature hole at a central portion.

6. The deposition rate measuring apparatus as claimed in claim 5, wherein a diameter of a first feature hole of a first cover portion adjacent to the crystal sensor from among the one or more cover portions is larger than a diameter of a second feature hole of a second cover portion away from the crystal sensor.

7. The deposition rate measuring apparatus as claimed in claim 3, wherein:
   the deposition-preventing bracket has the cone shape which becomes narrow toward the opening, and
   each cover portion is tapered in a direction of the crystal sensor with respect to an inner wall of the deposition-preventing bracket.

8. The deposition rate measuring apparatus as claimed in claim 4, wherein:
   the deposition-preventing bracket has a cone shape which becomes narrow toward the opening, and
   each cover portion has a funnel shape which becomes wide toward the opening as opposed to the deposition-preventing bracket.

9. The deposition rate measuring apparatus as claimed in claim 5, wherein a relative position of each cover portion is adjustable in a length direction with respect to an inner wall of the deposition-preventing bracket.

10. The deposition rate measuring apparatus as claimed in claim 1, wherein:
    the specific deposition material is a dopant material, and the at least one deposition material is a host material, and
    the dopant material is monitored without interference due to the host material.

11. The deposition rate measuring apparatus as claimed in claim 9, wherein:
    the deposition-preventing bracket has a pair of guide groove portions along the inner wall in the length direction, and
    each cover portion has a pair of engaging protrusions corresponding to the pair of guide groove portions in an external circumference portion having the circular plate shape including the feature hole at the central portion.

* * * * *